United States Patent
Huang et al.

(10) Patent No.: US 11,848,353 B2
(45) Date of Patent: Dec. 19, 2023

(54) METHOD OF FABRICATING SEMICONDUCTOR STRUCTURE

(71) Applicant: NANYA TECHNOLOGY CORPORATION, New Taipei (TW)

(72) Inventors: Ching-Chia Huang, Taipei (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 239 days.

(21) Appl. No.: 17/643,404

(22) Filed: Dec. 8, 2021

(65) Prior Publication Data

US 2022/0102484 A1 Mar. 31, 2022

Related U.S. Application Data

(62) Division of application No. 16/662,008, filed on Oct. 23, 2019, now Pat. No. 11,502,163.

(51) Int. Cl.
*H01L 21/762* (2006.01)
*H01L 29/423* (2006.01)
(Continued)

(52) U.S. Cl.
CPC .... *H01L 29/0607* (2013.01); *H01L 21/76237* (2013.01); *H01L 29/4236* (2013.01);
(Continued)

(58) Field of Classification Search
CPC . H01L 29/66787; H01L 29/7853–7854; H01L 21/823431; H01L 21/823821;
(Continued)

(56) References Cited

U.S. PATENT DOCUMENTS 5,995,531 A * 11/1999 Gaw ................... H01S 5/18355
372/46.015
6,355,517 B1 * 3/2002 Sunami ................. H10B 12/37
257/E27.092
(Continued)

FOREIGN PATENT DOCUMENTS

TW 201614806 A 4/2016

OTHER PUBLICATIONS

Myunghwan Ryu, et al., "Transistor Layout Optimization for Leakage Saving", IEEE(electronic ISBN: 978-1-4799-1142-4) & 2013 International SoC Design Conference (ISOCC), Nov. 17-19, 2013, pp. 253-254.

*Primary Examiner* — Maliheh Malek
(74) *Attorney, Agent, or Firm* — CKC & Partners Co., LLC

(57) ABSTRACT

A method includes forming a semiconductor layer on a semiconductor substrate. The semiconductor layer is patterned to form a semiconductive structure. Each of widths of two ends of the semiconductive structure is wider than a width of a middle of the semiconductive structure. The semiconductive structure is doped to form a doped semiconductor structure. An isolation structure is formed to surround the doped semiconductor structure. A recessing process is performed such that two trenches are formed on the doped semiconductor structure, and first, second and third portions of an active region are formed on the semiconductor substrate. A first gate structure and a second gate structure are formed in the trenches such that the first portion and the third portion are partially spaced apart by the first gate structure, and the second portion and the third portion are partially spaced apart by the second gate structure.

9 Claims, 15 Drawing Sheets

(51) Int. Cl.
*H01L 29/78* (2006.01)
*H01L 29/06* (2006.01)
*H10B 12/00* (2023.01)
*H01L 29/66* (2006.01)

(52) U.S. Cl.
CPC ...... *H01L 29/7813* (2013.01); *H01L 29/7825* (2013.01); *H01L 29/7853* (2013.01); *H01L 29/7854* (2013.01); *H01L 29/42336* (2013.01); *H01L 29/42352* (2013.01); *H01L 29/66787* (2013.01); *H01L 29/66795* (2013.01); *H01L 29/7851* (2013.01); *H10B 12/053* (2023.02)

(58) Field of Classification Search
CPC ............... H01L 21/845; H01L 27/0886; H01L 27/0924; H01L 27/10826; H01L 27/10879; H01L 27/1211; H01L 29/41791; H01L 29/66795–66818; H01L 29/785–7856; H01L 29/04–045; H01L 29/16–1608; H01L 29/18–185; H01L 29/22–2206; H01L 29/36–365; H01L 29/0607; H01L 21/76237; H01L 29/4236; H01L 29/7813; H01L 29/7825; H01L 29/42336; H01L 29/42352; H01L 29/66484; H01L 29/7831; H01L 29/41758; H01L 29/0638; H01L 29/401; H01L 29/66613–66628; H01L 29/7851; H10B 12/053

See application file for complete search history.

(56) References Cited

U.S. PATENT DOCUMENTS

| | | | |
|---|---|---|---|
| 8,134,398 B2 | 3/2012 | Kadoya | |
| 8,207,573 B2* | 6/2012 | Park | H01L 29/7834 257/E21.549 |
| 8,377,826 B2* | 2/2013 | Kim | H01L 29/7851 257/314 |
| 8,471,316 B2* | 6/2013 | Tai | H01L 27/1463 257/292 |
| 9,209,241 B2 | 12/2015 | Kim et al. | |
| 9,455,202 B2 | 9/2016 | Lee et al. | |
| 9,853,031 B1 | 12/2017 | Cho et al. | |
| 9,985,034 B2* | 5/2018 | Yoon | H10B 12/053 |
| 10,879,125 B2* | 12/2020 | Wu | H01L 21/823412 |
| 11,094,692 B2* | 8/2021 | Huang | H01L 21/823481 |
| 11,101,273 B1* | 8/2021 | Huang | H10B 12/34 |
| 11,114,445 B2* | 9/2021 | Choi | H10B 12/488 |
| 11,227,926 B2* | 1/2022 | Huang | H01L 29/7831 |
| 11,315,869 B1* | 4/2022 | Huang | H10B 12/37 |
| 11,315,928 B2* | 4/2022 | Shih | H10B 12/20 |
| 11,315,930 B2* | 4/2022 | Huang | H01L 29/4958 |
| 11,417,744 B2* | 8/2022 | Lu | H01L 29/518 |
| 11,488,868 B2* | 11/2022 | Wu | H01L 29/66818 |
| 11,488,961 B2* | 11/2022 | Cheng | H10B 12/34 |
| 11,521,974 B2* | 12/2022 | Chien | H01L 21/7682 |
| 2005/0009269 A1 | 1/2005 | Shinkawata et al. | |
| 2005/0077568 A1 | 4/2005 | Park et al. | |
| 2006/0049429 A1* | 3/2006 | Kim | H01L 29/78654 257/E21.415 |
| 2007/0097777 A1* | 5/2007 | Sakagami | H10B 69/00 257/E27.103 |
| 2008/0003833 A1* | 1/2008 | Kim | H01L 29/7851 257/E21.409 |
| 2008/0023757 A1* | 1/2008 | Kujirai | H01L 29/66795 438/157 |
| 2008/0157194 A1 | 7/2008 | Lee et al. | |
| 2008/0164514 A1* | 7/2008 | Sugioka | H10B 12/053 257/E29.345 |
| 2009/0263973 A1* | 10/2009 | Kim | H01L 29/66795 257/E21.214 |
| 2009/0267126 A1* | 10/2009 | Wang | H01L 21/823487 257/302 |
| 2010/0072545 A1 | 3/2010 | Ryu et al. | |
| 2010/0078698 A1 | 4/2010 | Son et al. | |
| 2011/0014792 A1* | 1/2011 | Kim | H01L 29/66795 257/E21.24 |
| 2011/0237037 A1 | 9/2011 | Park et al. | |
| 2012/0231605 A1 | 9/2012 | Kim et al. | |
| 2012/0273859 A1* | 11/2012 | Oyu | H01L 28/91 257/296 |
| 2012/0299090 A1 | 11/2012 | Kim et al. | |
| 2013/0105867 A1* | 5/2013 | Wang | H01L 29/0649 257/E21.409 |
| 2013/0113048 A1* | 5/2013 | Chien | H01L 21/823418 257/E21.632 |
| 2013/0320345 A1* | 12/2013 | Im | H01L 21/02532 438/479 |
| 2014/0010007 A1 | 1/2014 | Cho | |
| 2015/0123195 A1* | 5/2015 | Wu | H01L 29/66621 438/270 |
| 2015/0372137 A1 | 12/2015 | Sakogawa | |
| 2016/0035830 A1* | 2/2016 | Kim | H01L 29/78696 257/43 |
| 2016/0197084 A1* | 7/2016 | Yoon | H10B 12/053 438/270 |
| 2017/0256628 A1* | 9/2017 | Lim | H01L 29/66621 |
| 2017/0263723 A1* | 9/2017 | Lee | H01L 29/7827 |
| 2018/0181695 A1 | 6/2018 | Kim et al. | |
| 2019/0198502 A1 | 6/2019 | Huang et al. | |
| 2020/0013668 A1* | 1/2020 | Choi | H10N 70/8828 |
| 2020/0168611 A1 | 5/2020 | Jeon et al. | |
| 2020/0211900 A1* | 7/2020 | Wu | H01L 29/7851 |
| 2020/0388696 A1* | 12/2020 | Martin | H01L 29/1008 |
| 2021/0090957 A1* | 3/2021 | Wu | H01L 29/7851 |
| 2021/0091020 A1* | 3/2021 | Wang | H01L 24/05 |
| 2021/0111178 A1* | 4/2021 | Choi | G11C 7/06 |
| 2021/0126090 A1 | 4/2021 | Kim et al. | |
| 2021/0126098 A1 | 4/2021 | Lee et al. | |
| 2021/0143149 A1* | 5/2021 | Huang | H10B 12/34 |
| 2021/0320104 A1* | 10/2021 | Huang | H01L 21/823481 |
| 2021/0408251 A1* | 12/2021 | Huang | H10B 12/488 |
| 2022/0085180 A1* | 3/2022 | Huang | H10B 12/34 |
| 2022/0157821 A1* | 5/2022 | Chien | H10B 12/482 |
| 2022/0157825 A1* | 5/2022 | Lu | H10B 12/482 |
| 2022/0285359 A1* | 9/2022 | Cheng | H10B 12/488 |
| 2023/0197809 A1* | 6/2023 | Tsai | H01L 29/41791 257/330 |
| 2023/0223298 A1* | 7/2023 | Liao | H01L 21/31116 438/424 |
| 2023/0262965 A1* | 8/2023 | Lu | H10B 12/053 257/296 |

\* cited by examiner

10

10

US 11,848,353 B2

METHOD OF FABRICATING SEMICONDUCTOR STRUCTURE

CROSS-REFERENCE TO RELATED APPLICATION

This application is a Divisional Application of the U.S. application Ser. No. 16/662,008, filed on Oct. 23, 2019, the entirety of which is incorporated by reference herein in their entireties.

BACKGROUND

Technical Field

The present disclosure relates to a method of fabricating the semiconductor structure.

Description of Related Art

With the rapid growth of electronic industry, the development of semiconductor devices has achieved high performance and miniaturization. As the size of semiconductor devices shrinks, the gate channel length decreases correspondingly. Consequently, a short channel effect may occur. To deal with such problem, recessed channel array transistor (RCAT) utilized for dynamic random access memory (DRAM) device has been developed to suppressing the short channel effect by increasing the gate channel length without an increase in a lateral area of a gate electrode.

However, in a conventional RCAT device, a leakage problem (e.g., gate induced drain leakage) may occur. The leakage problem adversely affects the refresh or date retention characteristic of the DRAM device.

SUMMARY

According to some embodiments of the present disclosure, a method of fabricating a semiconductive structure includes the following steps. A semiconductor layer is formed on a semiconductor substrate. The semiconductor layer is patterned to form a semiconductive structure on the semiconductor substrate. Each of widths of two ends of the semiconductive structure is wider than a width of a middle of the semiconductive structure. The semiconductive structure is doped to form a doped semiconductor structure. An isolation structure is formed to surround the doped semiconductor structure. A recessing process is performed such that two trenches are formed on the doped semiconductor structure, and a first portion, a second portion, and a third portion of an active region are formed on the semiconductor substrate. A first gate structure and a second gate structure are formed in the trenches such that the first portion and the third portion are partially spaced apart by the first gate structure, and the second portion and the third portion are partially spaced apart by the second gate structure.

According to some embodiments of the present disclosure, the doped semiconductor structure has a dumbbell shape, in a top view.

According to some embodiments of the present disclosure, the method further includes forming a gate dielectric layer on sidewalls of the first portion, the second portion, and the third portion of the active region before the first gate structure and the second gate structure are formed.

According to some embodiments of the present disclosure, the method further includes forming a dielectric layer on the first gate structure and the second gate structure.

According to some embodiments of the present disclosure, the gate dielectric layer has a portion between the dielectric layer and the active region.

According to some embodiments of the present disclosure, the gate dielectric layer has a portion between the first gate structure and the second gate structure and the active region.

According to some embodiments of the present disclosure, patterning the semiconductor layer to form the semiconductive structure on the semiconductor substrate is performed by using an extreme ultraviolet lithography process.

According to some embodiments of the present disclosure, doping the semiconductive structure further comprises a doping operation such that a first doped region and a second doped region are formed.

According to some embodiments of the present disclosure, a doping impurity of the first doped region is different from that of the second doped region.

In summary, the disclosure provides a method of fabricating a semiconductor structure. The semiconductor structure includes an active region, an isolation structure, a first gate structure, and a second gate structure. The active portion has a first portion, a second portion, and a third portion between the first portion and the second portion. A shape of the first portion is different from a shape of the third portion. By using this semiconductor structure, not only better driving capability can be achieved but also leakage property can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
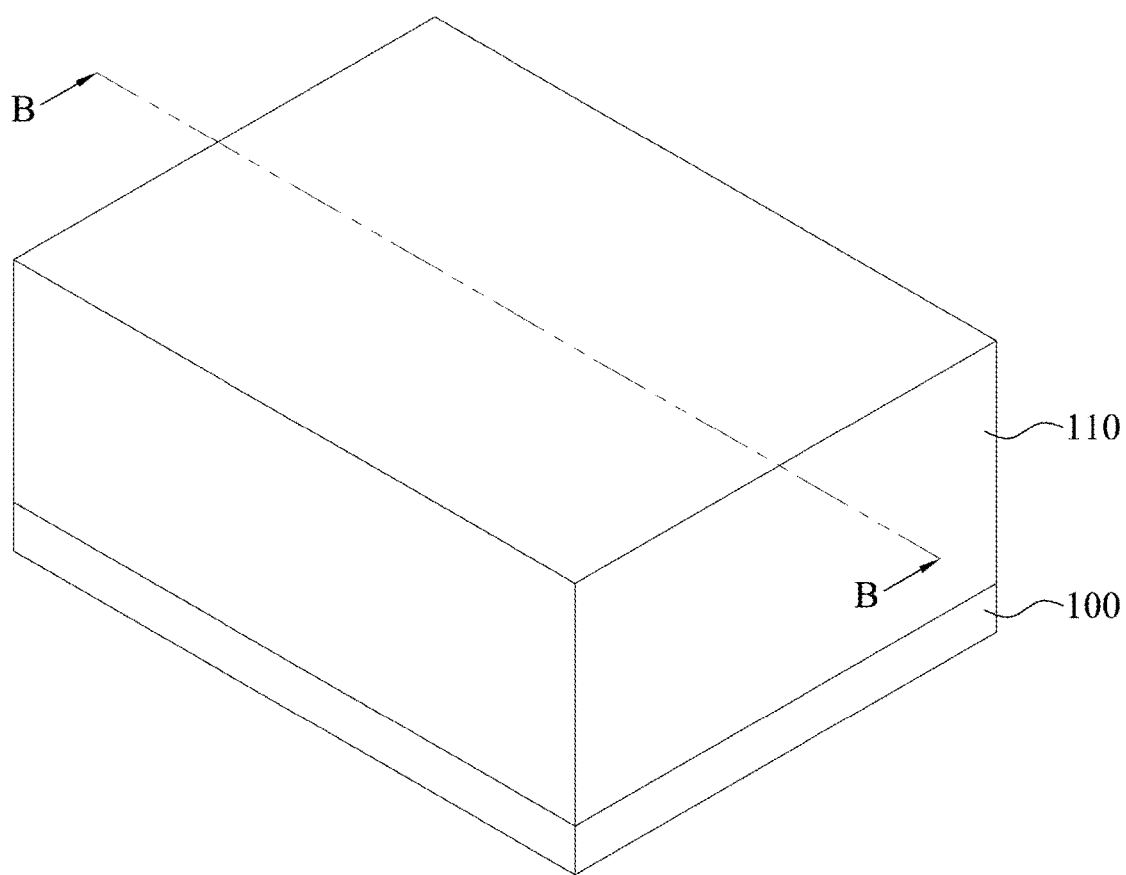
FIGS. 1A, 2A, 3A, 4A, 5A, 6A, and 7A are schematic oblique views of a method of forming a semiconductor structure at various stages in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIGS. 1A, 2A, 3A, 4A, 5A, 6A, and 7A are schematic oblique views of a method of forming a semiconductor structure 10 at various stages in accordance with some embodiments of the present disclosure.

Figure 1B:
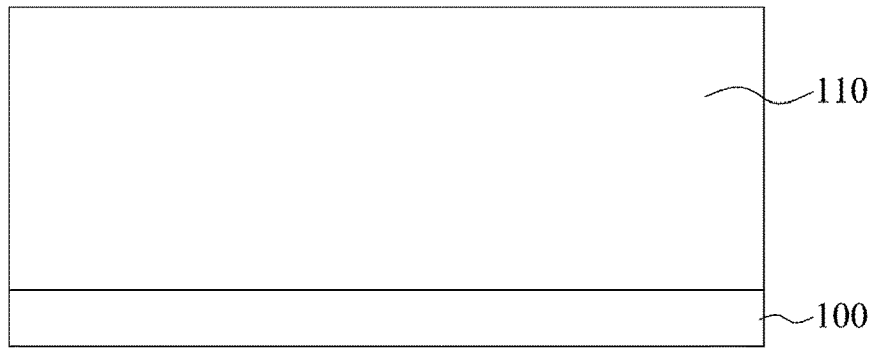
FIGS. 1B, 2B, 3B, 4B, 5B, 6B, and 7B are cross-sectional views taken along line B-B of FIGS. 1A, 2A, 3A, 4A, 5A, 6A, and 7A, respectively.
Figure 1C:
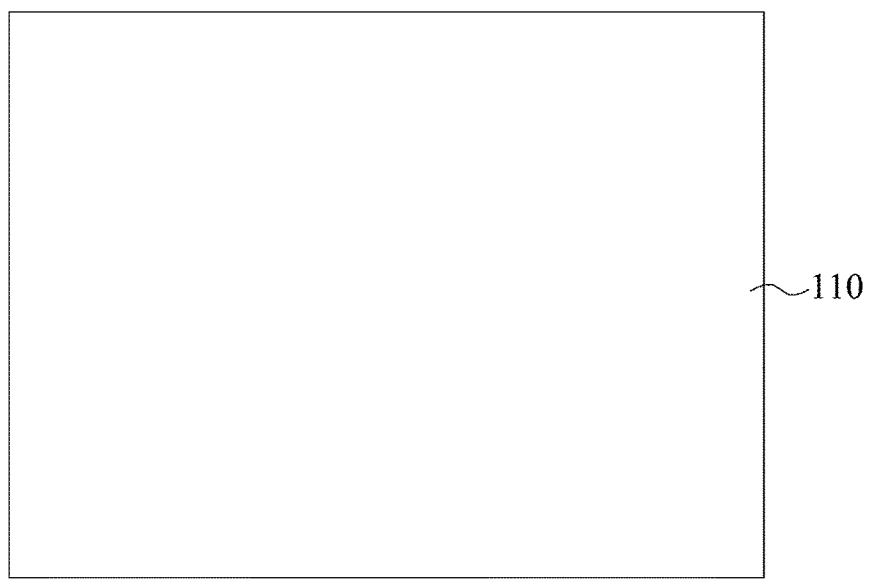
FIGS. 1C, 2C, 3C, 4C, 5C, 6C, and 7C are top views of FIGS. 1A, 2A, 3A, 4A, 5A, 6A, and 7A, respectively.

Referring to FIGS. 1A to 1C, FIG. 1B is a cross-sectional view taken along line B-B of FIG. 1A, and FIG. 1C is a top view of FIG. 1A. A semiconductor layer 110 is formed on a semiconductor substrate 100. In some embodiments, the semiconductor substrate 100 is a silicon substrate. Alternatively, the semiconductor substrate 100 may include another elementary semiconductor, such as germanium; a compound semiconductor including silicon carbide, gallium arsenide, gallium phosphide, indium phosphide, and/or indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a SOI such as having a buried layer. In some embodiments, the semiconductor layer 110 is made of silicon.

Figure 2A:
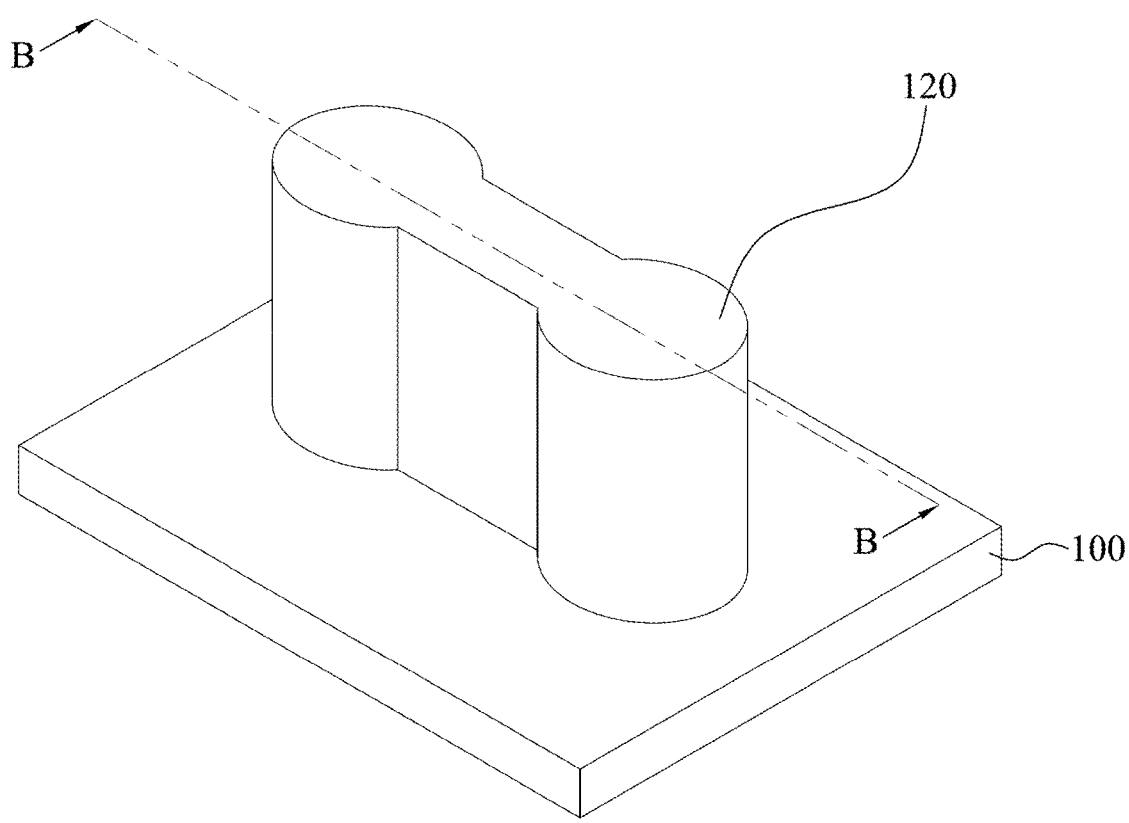
Figure 2B:
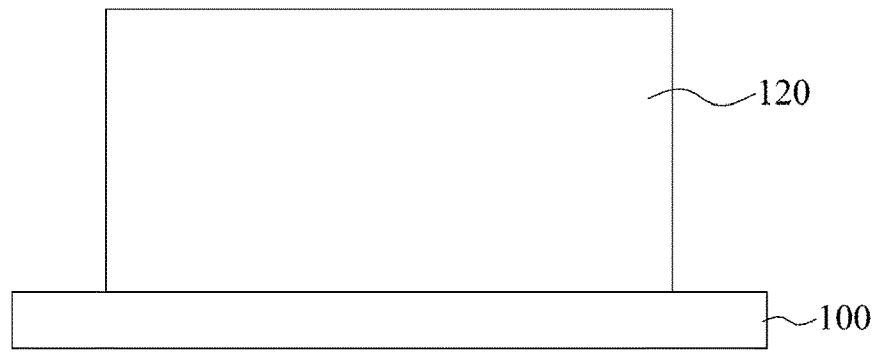
Figure 2C:
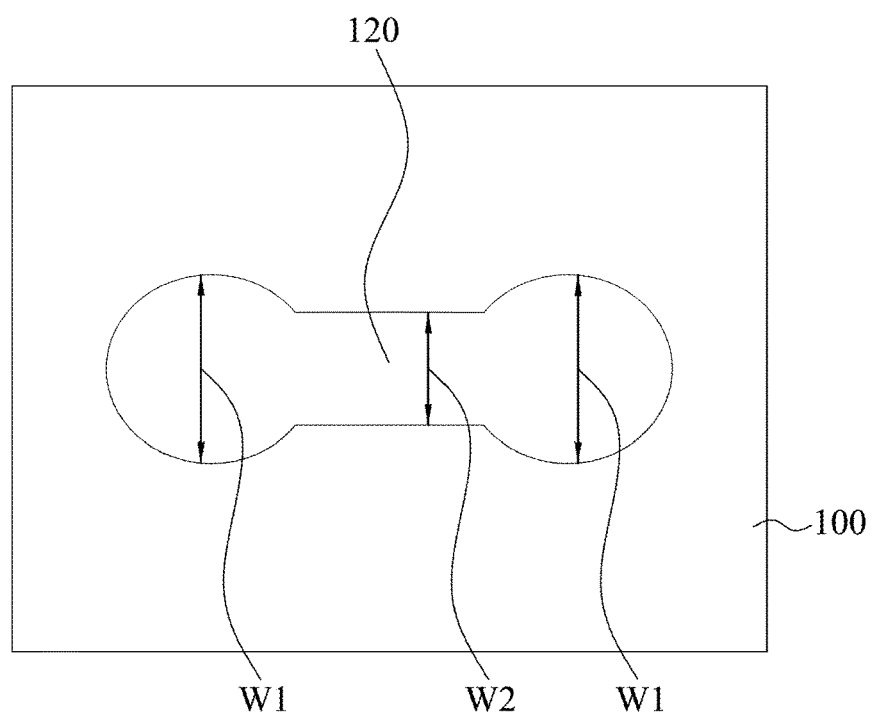

Referring to FIGS. 2A to 2C, FIG. 2B is a cross-sectional view taken along line B-B of FIG. 2A, and FIG. 2C is a top view of FIG. 2A. The semiconductor layer 110 (see FIGS. 1A, 1B, and 1C) is patterned to form a semiconductive structure 120 on the semiconductor substrate 100.

In some embodiments, each of widths W1 of two ends of the semiconductive structure 120 is wider than a width W2 of a middle of the semiconductive structure 120. In other words, the width W2 is narrower than each of the widths W1. In some embodiments, as shown in FIG. 2C, the doped semiconductive structure 120 has a dumbbell shape, in a top view.

In some embodiments, the semiconductor layer 110 (see FIGS. 1A, 1B, and 1C) may be patterned by any suitable method. For example, the semiconductor layer 110 (see FIGS. 1A, 1B, and 1C) may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process.

In some embodiments, patterning the semiconductor layer 110 (see FIGS. 1A, 1B, and 1C) to form the semiconductive structure 120 on the semiconductor substrate 100 is performed by using an extreme ultraviolet lithography (EUV, or called EUVL) process. In greater details, the extreme ultraviolet lithography process includes deposing a reflective optics device with multilayer mirrors surrounding a hydrogen gas, and injecting the tin (Sn) plasma from a light source. The hydrogen gas is used to prevent the deposition of tin which would otherwise deposit on a surface of the mirrors of the reflective optics device. In some embodiments, the extreme ultraviolet lithography process is utilized to an extreme ultraviolet wavelength (e.g., 13.5 nm) to form the semiconductive structure 120. The extreme ultraviolet lithography process is beneficial to form the shape (e.g., dumbbell shape) of the semiconductive structure 120.

Figure 3A:
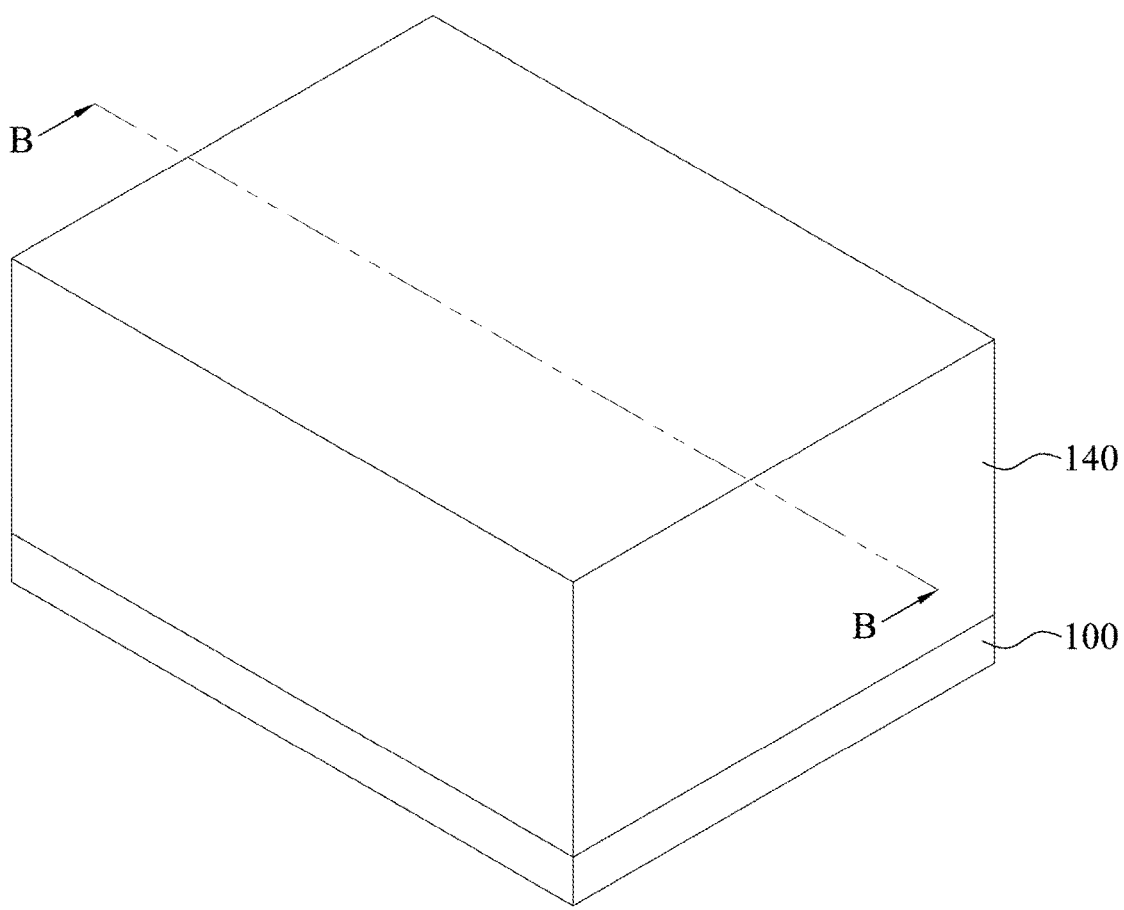
Figure 3B:
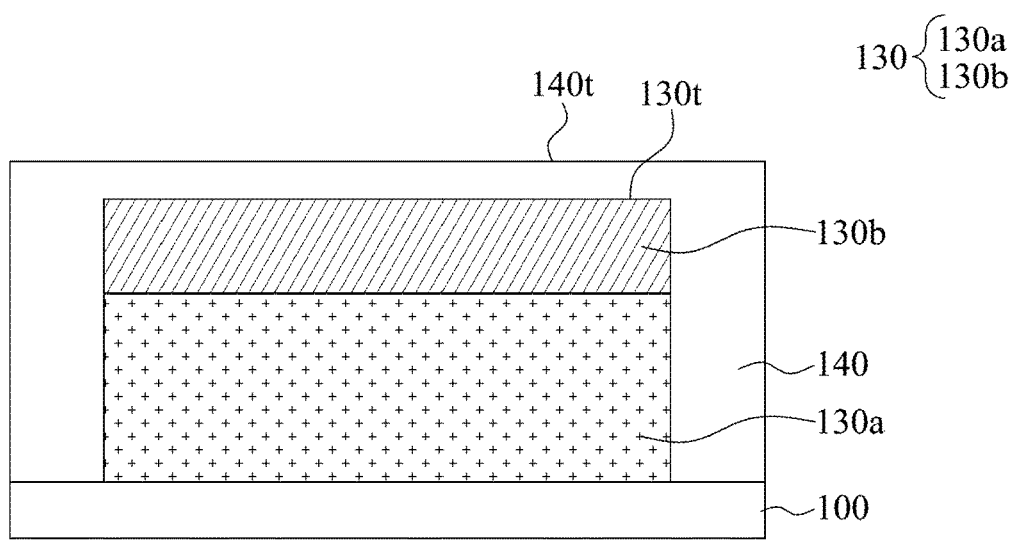
Figure 3C:
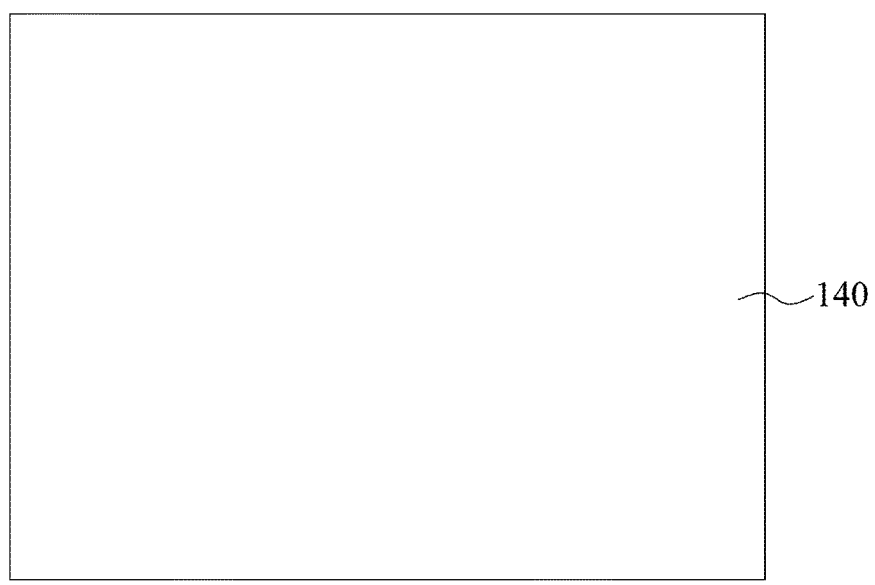

Referring to FIGS. 3A to 3C, FIG. 3B is a cross-sectional view taken along line B-B of FIG. 3A, and FIG. 3C is a top view of FIG. 3A. The semiconductive structure 120 (see FIGS. 2A, 2B, and 2C) is doped to form a doped semiconductor structure 130. An isolation structure 140 is formed surrounding the doped semiconductor structure 130. In greater detail, the isolation structure 140 fully covers the doped semiconductor structure 130. In other words, a top surface 140t of the isolation structure 140 is at higher elevation than a top surface 130t of the doped semiconductor structure 130 from the semiconductor substrate 100. In some embodiments, the doped semiconductor structure 130 is embedded in the isolation structure 140.

In some embodiments, doping the semiconductive structure 120 (see FIGS. 2A, 2B, and 2C) further includes a doping operation such that a first doped region 130a and a second doped region 130b of the doped semiconductor structure 130 are formed. In greater details, a doping impurity of the first doped region 130a is different from that of the second doped region 130b. Stated differently, a dopant of the first doped region 130a is different from that of the second doped region 130b. For example, the dopant of the first doped region 130a is p-type dopant (e.g., boron or indium), while the dopant of the second doped region 130b is n-type dopant (e.g., arsenic or phosphorus). In some embodiments, the isolation structure 140 can serve as a shielding layer during the doping operation, so that the tunneling effect of doped ions, e.g., p-type dopants or n-type dopants, can be reduced.

In some embodiments, the isolation structure 140 may be formed by depositing a silicon oxide layer, a silicon nitride layer or a silicon oxynitride layer, and the like. The formation methods of the isolation structure 140 include physical vapor deposition (PVD), chemical vapor deposition (CVD), and the like.

Figure 4A:
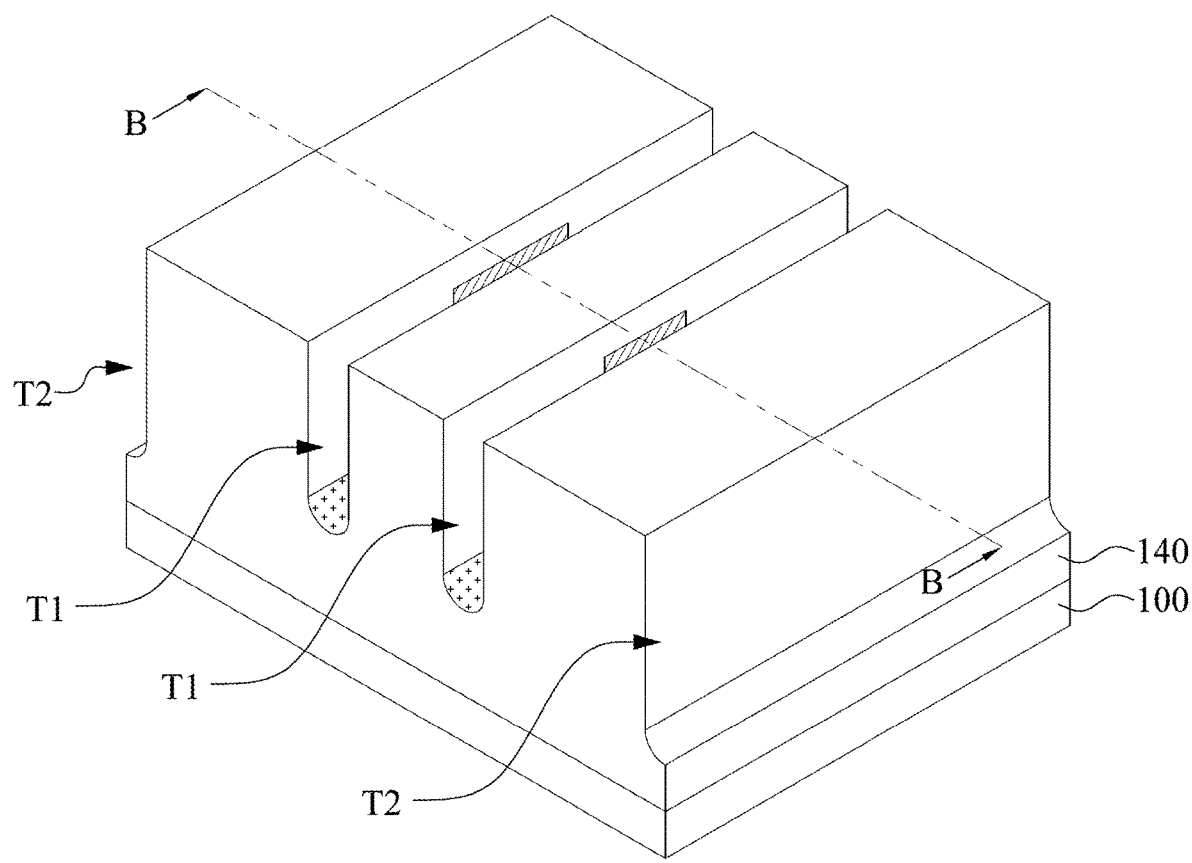
Figure 4B:
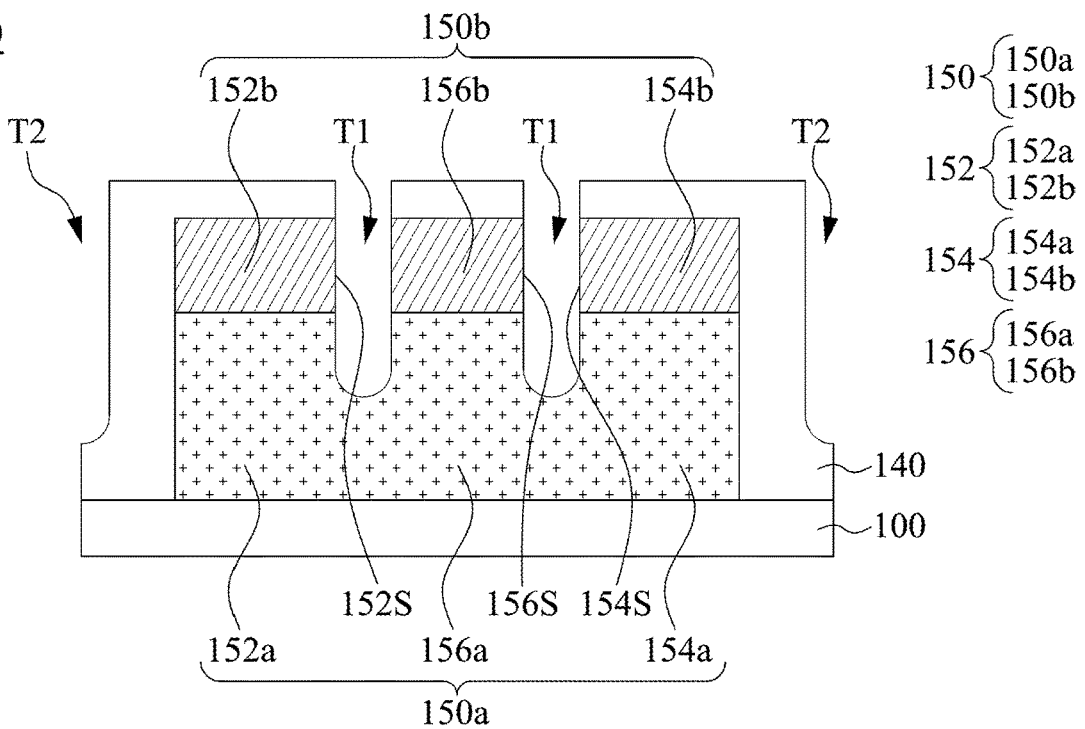
Figure 4C:
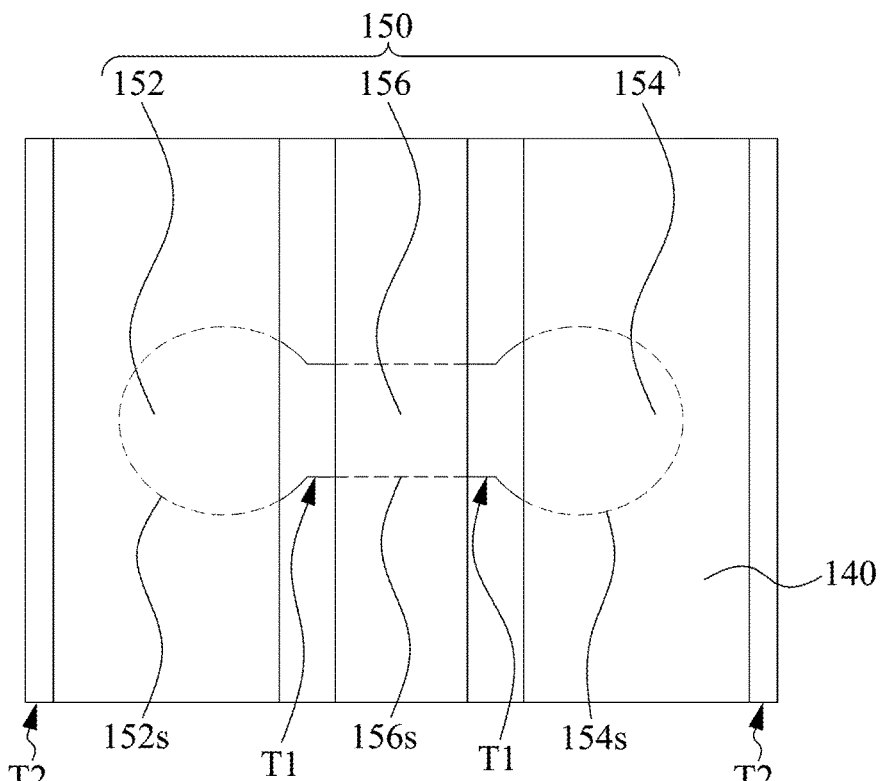

Referring to FIGS. 4A to 4C, FIG. 4B is a cross-sectional view taken along line B-B of FIG. 4A, and FIG. 4C is a top view of FIG. 4A. For convenience of explanation, dashed lines in FIG. 4C are used to illustrate the profile of an active region 150. A recessing process is performed such that two trenches T1 and two trenches T2 are formed on the doped semiconductor structure 130 (see FIGS. 3A, 3B, and 3C), and a first portion 152, a second portion 154, and a third portion 156 of the active region 150 are formed on the semiconductor substrate 100. In greater details, the third portion 156 is disposed between the first portion 152 and the second portion 154. The first portion 152 has a first segment 152a and a second segment 152b, the second portion 154 has a first segment 154a and a second segment 154b, and the third portion 156 has a first segment 156a and a second segment 156b. The first segments 152a, 154a, and 156a serves as a first doped region 150a, and the second segments 152b, 152b, and 156b serves as a second doped region 150b. To clarify, the first doped region 150a and the second doped region 150b of the active region 150 is similar to the first doped region 130a and the second doped region 130b of the doped semiconductor structure 130 (see FIGS. 3A, 3B, and 3C), and not described herein. After the trenches T1 and T2 are formed, a portion of a sidewall 152s of the first portion 152, a portion of a sidewall 154s of the second portion 154, and a portion of a sidewall 156s of the third portion 156 are exposed. In other words, a portion of the sidewalls 152s, 154s, and 156s are exposed, while the remaining portion of the sidewalls 152s, 154s, and 156s are covered by the isolation structure 140.

As shown in FIG. 4C, a shape of the first portion 152 is different from a shape of the third portion 156. For example, the shape of the first portion 152 is round or oval, while the shape of the third portion 156 is rectangular. In some embodiments, a shape of the second portion 154 is same as the shape of the first portion 152. For example, the shape of the second portion 154 is oval, and the shape of the first portion 152 is oval as well.

In some embodiments, as shown in FIG. 4C, the sidewall 152s of the first portion 152 of the active region 150 has a curved section, in the top view. In other embodiments, as shown in FIG. 4C, the sidewall 154s of the second portion 154 of the active region 150 has a curved section, in the top view. In other embodiments, as shown in FIG. 4C, the sidewall 156s of the third portion 156 of the active region 150 has a straight section, in the top view.

In some embodiments, as shown in FIG. 4B, a bottom surface of the active region 150 and a bottom surface of the isolation structure 140 are in contact with the semiconductor substrate 100.

In some embodiments, the recessing process may include a dry etching process, a wet etching process, and/or combinations thereof. The recessing process may also include a selective wet etching process or a selective dry etching process. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 5A:
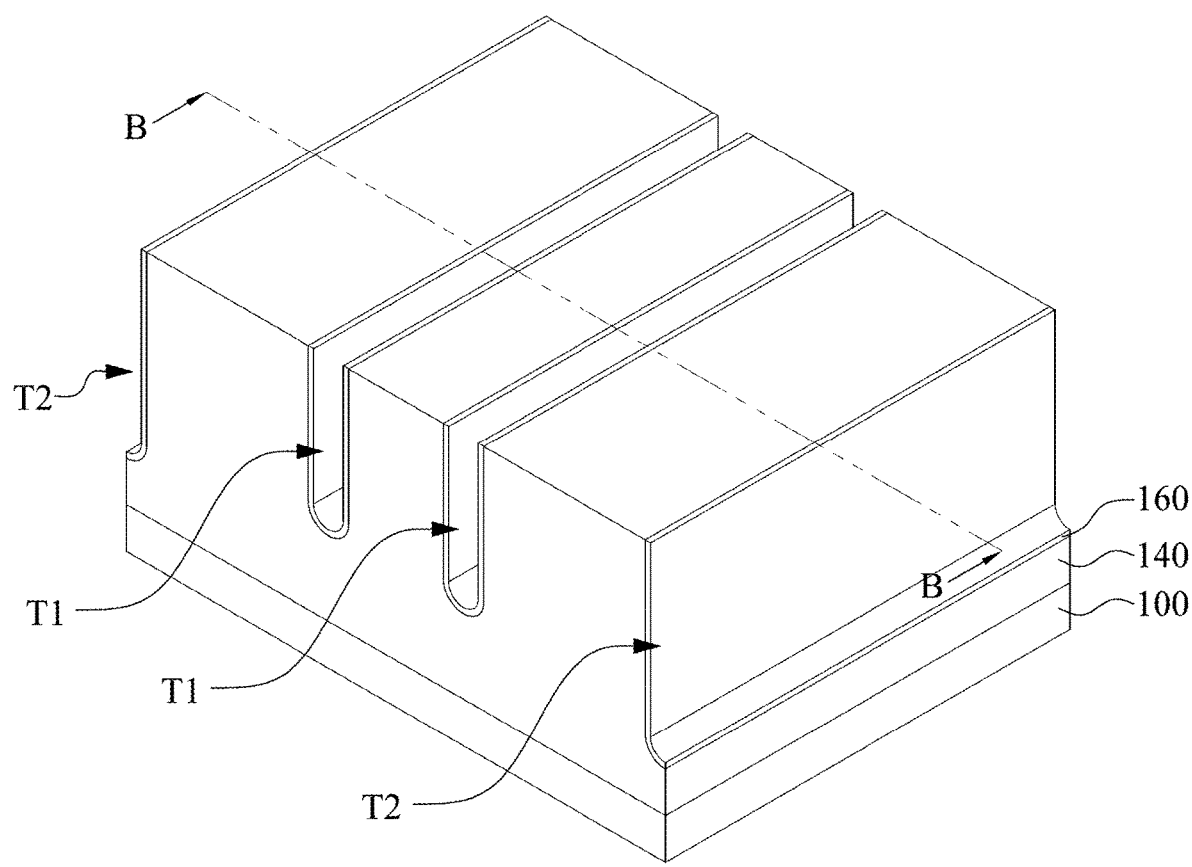
Figure 5B:
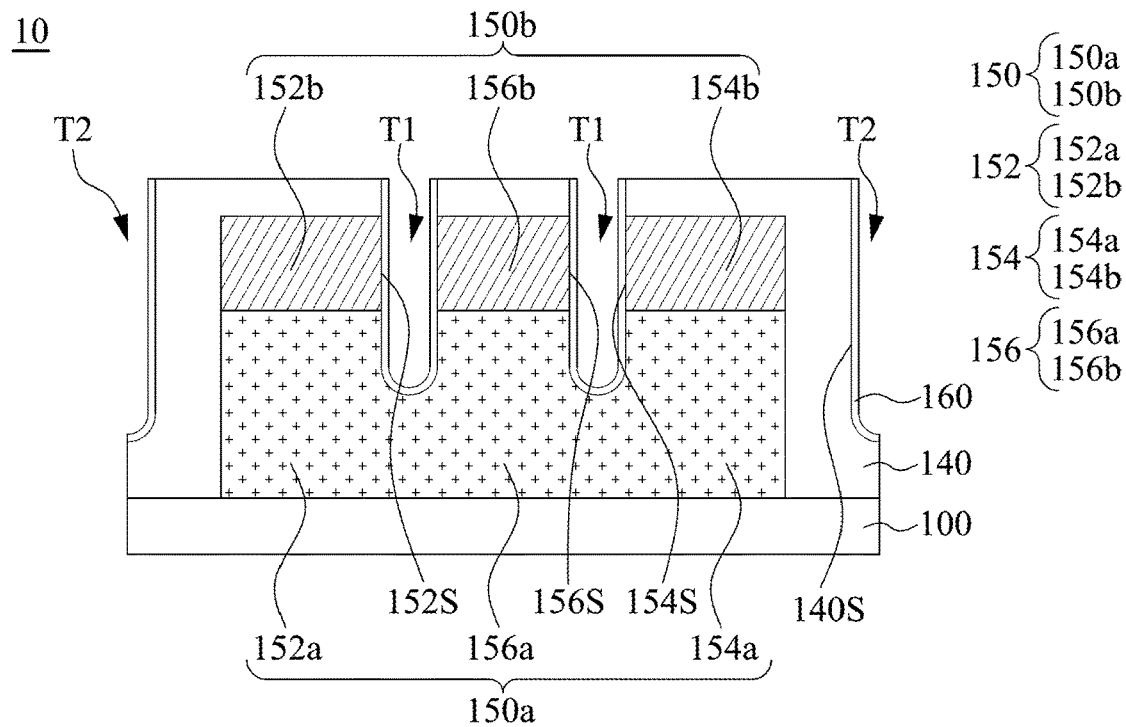
Figure 5C:
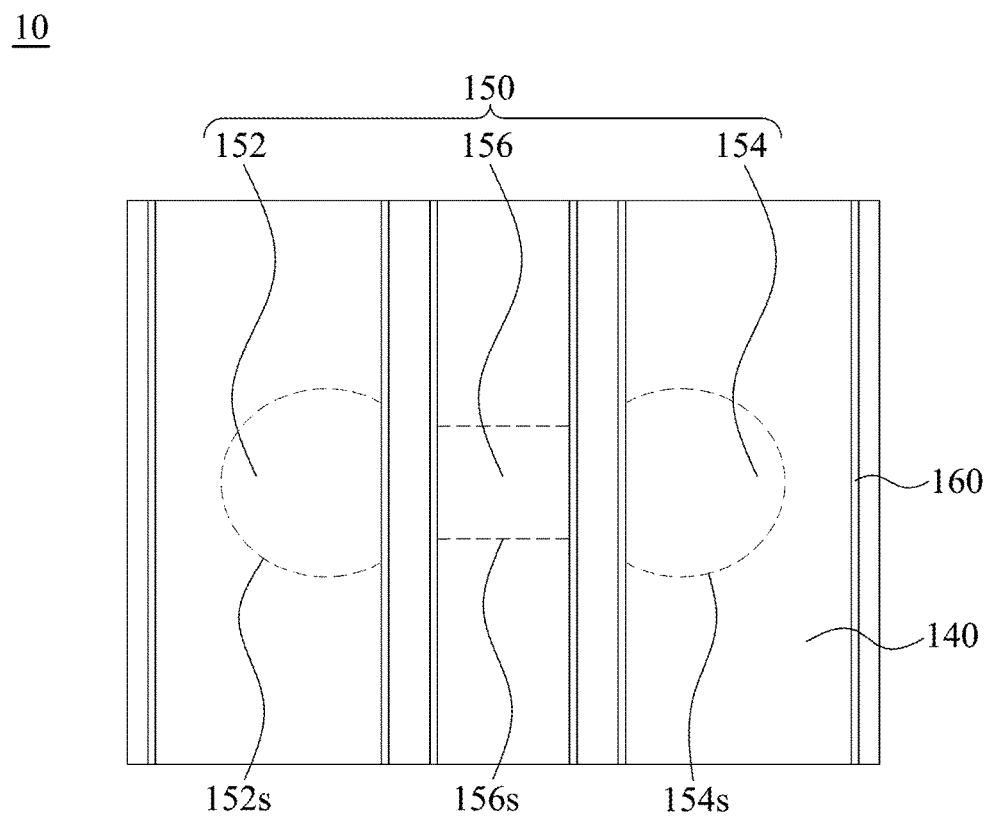

Referring to FIGS. 5A to 5C, FIG. 5B is a cross-sectional view taken along line B-B of FIG. 5A, and FIG. 5C is a top view of FIG. 5A. A gate dielectric layer 160 is formed in the trenches T1 and T2. In other words, the gate dielectric layer 160 is formed between the sidewall 152s of the first portion 152 and the sidewall 156s of the third portion 156, and between the sidewall 156s of the third portion 156 and the sidewall 154s of the second portion 154. The gate dielectric layer 160 is further formed on a sidewall 140s of the isolation structure 140.

In some embodiments, the gate dielectric layer 160 includes one or more layers of a dielectric material, such as silicon oxide, titanium nitride, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, the gate dielectric layer 160 may be formed by CVD, atomic layer deposition (ALD) or any suitable method. In one embodiment, the gate dielectric layer 160 is formed using a highly conformal deposition process such as ALD in order to ensure the formation of gate dielectric layer 160 having a uniform thickness.

Figure 6A:
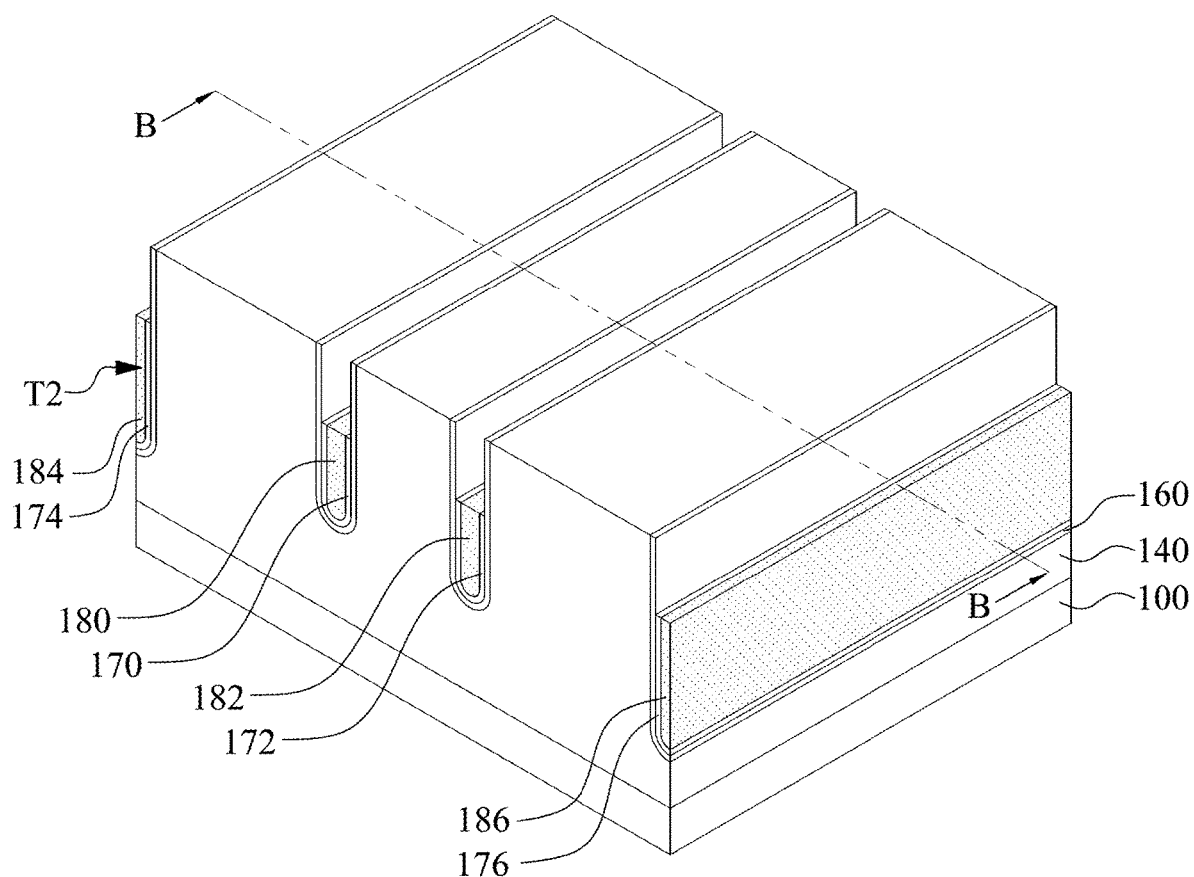
Figure 6B:
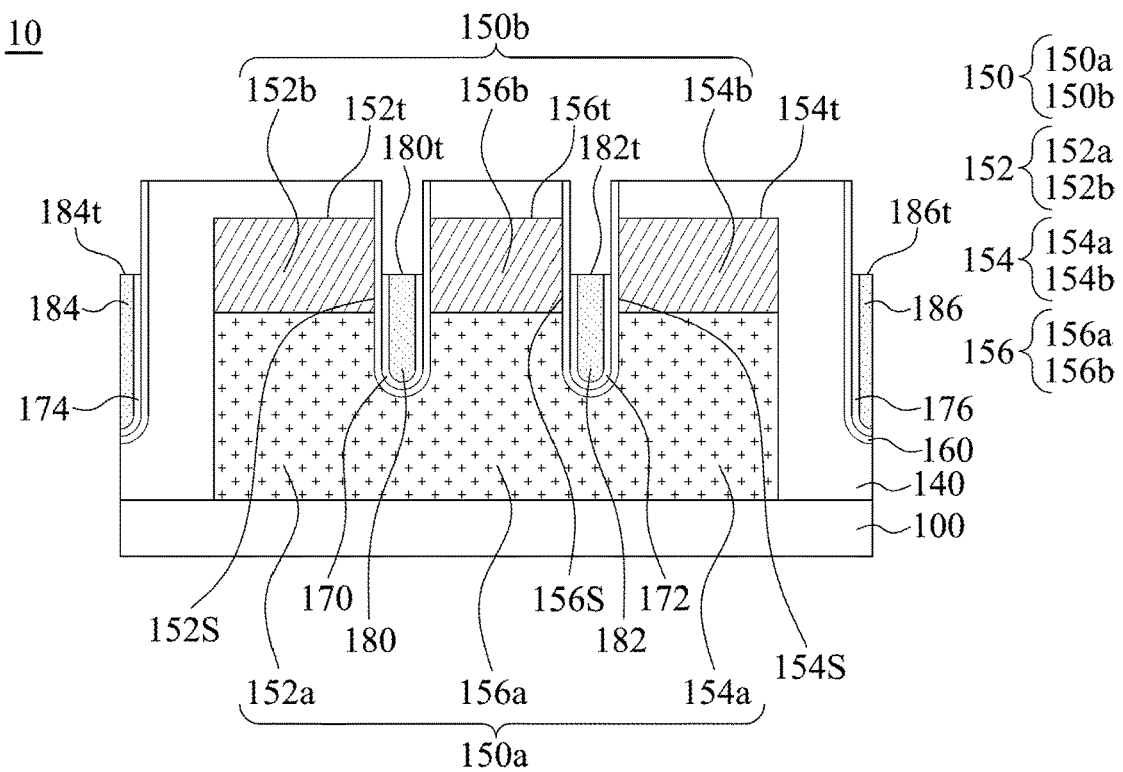
Figure 6C:
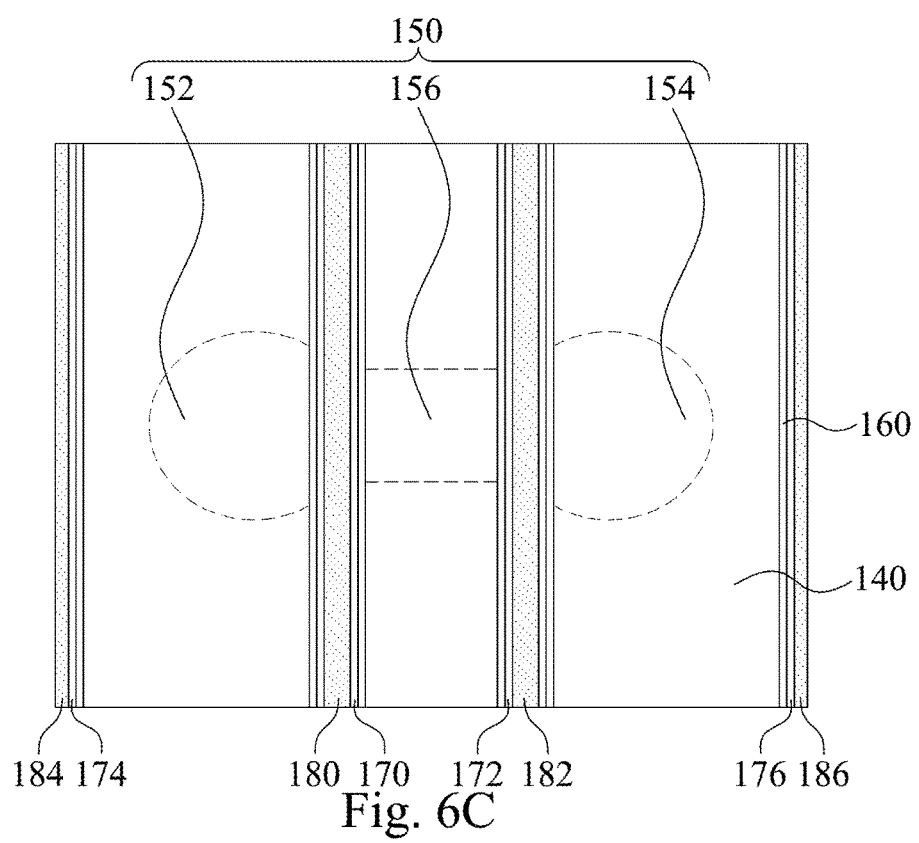

Referring to FIGS. 6A to 6C, FIG. 6B is a cross-sectional view taken along line B-B of FIG. 6A, and FIG. 6C is a top view of FIG. 6A. A first adhesion layer 170 and a second adhesion layer 172 are formed in the trenches T1, and a third adhesion layer 174 and a fourth adhesion layer 176 are formed in the trenches T2. After the first adhesion layer 170, the second adhesion layer 172, the third adhesion layer 174 and the fourth adhesion layer 176 are formed, a first gate structure 180, a second gate structure 182, a third gate structure 184, and a fourth gate structure 186 are formed. In greater details, the first gate structure 180 and the second gate structure 182 are formed in the trenches T1 (see FIGS. 5A, 5B, and 5C) such that the first portion 152 of the active region 150 and the third portion 156 of the active region 150 are partially spaced apart by the first gate structure 180, and the second portion 154 of the active region 150 and the third portion 156 of the active region 150 are partially spaced apart by the second gate structure 182. In other words, the first gate structure 180 and the second gate structure 182 are formed on the gate dielectric layer 160. In some embodiments, the third gate structure 184 and the fourth gate structure 186 are formed in the trenches T2 (see FIGS. 5A, 5B, and 5C). In some embodiments, the first gate structure 180 and the second gate structure 182 serves as word lines (WL), while the third gate structure 184 and the fourth gate structure 186 serves as passing word lines (PWL).

In some embodiments, the method of forming the first adhesion layer 170, the second adhesion layer 172, the first gate structure 180, and the second gate structure 182 may include filling adhesion materials and conductive materials in the trench T1 (see FIGS. 5A, 5B, and 5C) and then performing an etch-back operation. In some embodiments, the method of forming the third adhesion layer 174, the fourth adhesion layer 176, the third gate structure 184, and the fourth gate structure 186 may include filling adhesion materials and conductive materials in the trench T2 (see FIGS. 5A, 5B, and 5C) and then performing an etch-back operation.

In some embodiments, the first adhesion layer 170 and the second adhesion layer 172 can adhere the first gate structure 180 and the second gate structure 182, respectively. The first adhesion layer 170 and the second adhesion layer 172 respectively enables the first gate structure 180 and the second gate structure 182 to have improved filling characteristics in the remaining trenches T1, and therefore results in forming the first gate structure 180 and the second gate structure 182 without leaving unfilled voids therein. Similarly, the third adhesion layer 174 and the fourth adhesion layer 176 can adhere the third gate structure 184 and the fourth gate structure 186, respectively. The third adhesion layer 174 and the fourth adhesion layer 176 respectively enables the third gate structure 184 and the fourth gate structure 186 to have improved filling characteristics in the remaining trenches T2 and therefore results in forming the third gate structure 184 and the fourth gate structure 186 without leaving unfilled voids therein. In some embodiments, the first adhesion layer 170, the second adhesion layer 172, third adhesion layer 174 and the fourth adhesion layer 176 may be made of titanium nitride (TiN).

In some embodiments, a top surface 180t of the first gate structure 180 is below a top surface of the active region 150. In greater details, the top surface 180t of the first gate structure 180 is below a top surface 152t of the first portion 152, a top surface 154t of the second portion 154, and a top surface 156t of the third portion 156. In some embodiments, a top surface 182t of the second gate structure 182 is below the top surface of the active region 150. In greater details, the top surface 182t of the second gate structure 182 is below the top surface 152t of the first portion 152, the top surface 154t of the second portion 154, and the top surface 156t of the third portion 156.

In some embodiments, the top surface 180t of the first gate structure, the top surface 182t of the second gate structure 182, a top surface 184t of the third gate structure 184, and a top surface 186t of the fourth gate structure 186 are at same horizontal level.

In some embodiments, the gate dielectric layer 160 is between the first gate structure 180 and the active region 150, and between the second gate structure 182 and the active region 150. In greater details, the gate dielectric layer 160 is between the first gate structure 180 and the sidewall 152s of the first portion 152 and the sidewall 156s of the third portion 156. The gate dielectric layer 160 is between the second gate structure 182 and the sidewall 154s of the second portion 154 and the sidewall 156s of the third portion 156.

In some embodiments, materials of the first gate structure 180, the second gate structure 182, the third gate structure 184, and the fourth gate structure 186 may be conductive materials such as tungsten or other suitable conductive materials. In some embodiments, the material of the first gate structure 180 is same as the material of the second gate structure 182, and the material of the third gate structure 184 is same as the material of the fourth gate structure 186. In other embodiments, the material of the first gate structure 180, the second gate structure 182, the third gate structure 184, and the fourth gate structure 186 are same.

Figure 7A:
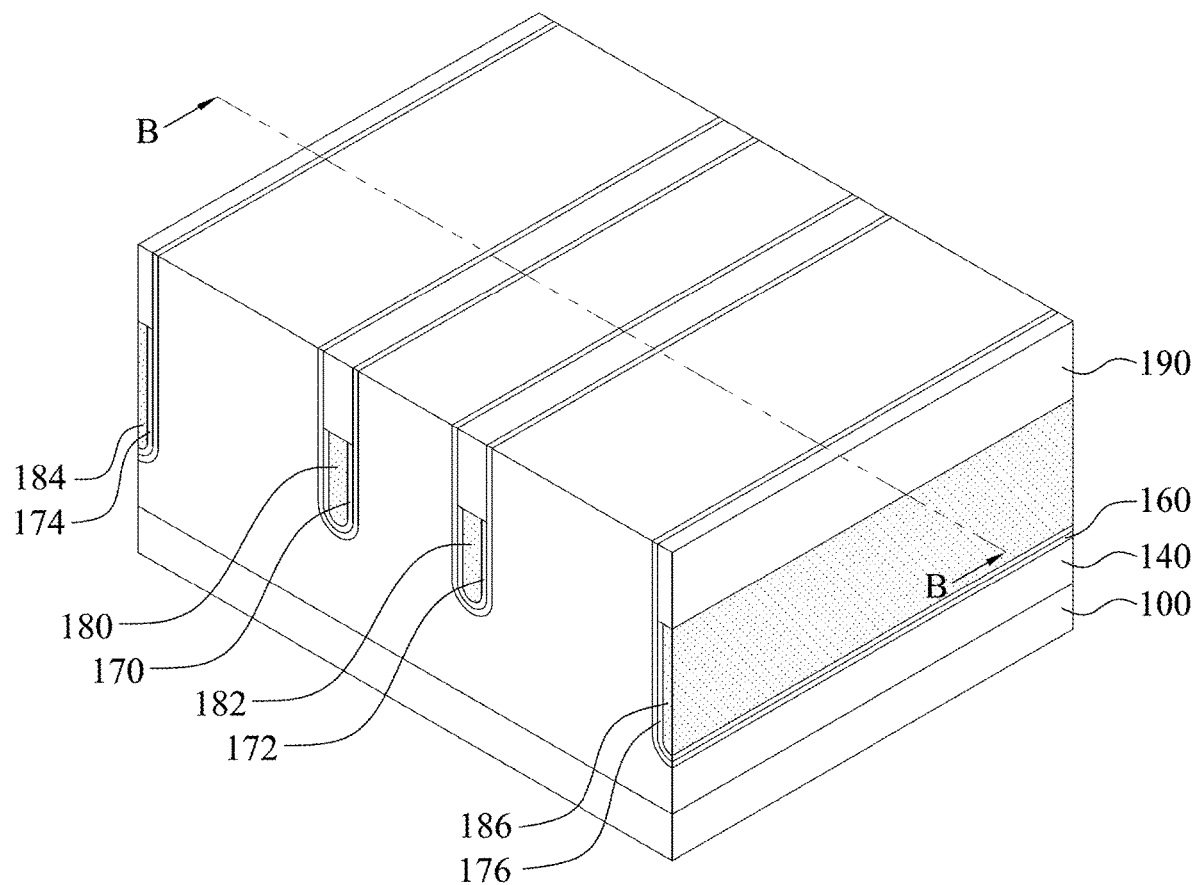
Figure 7B:
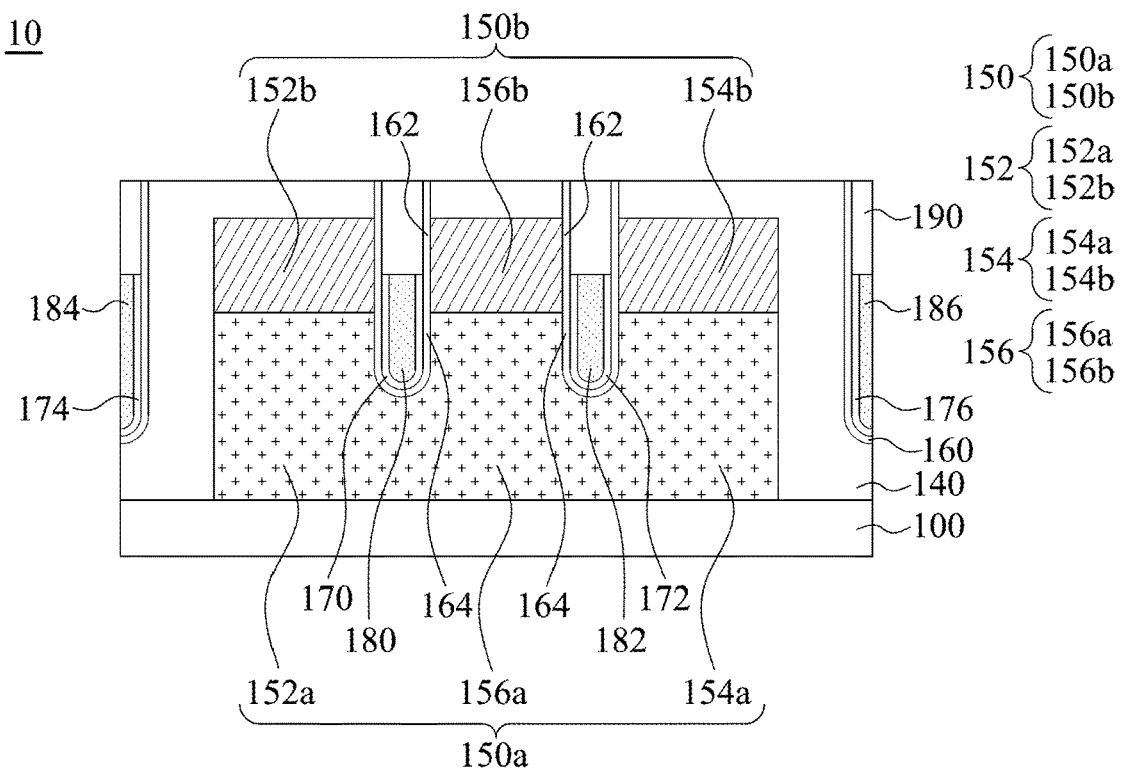
Figure 7C:
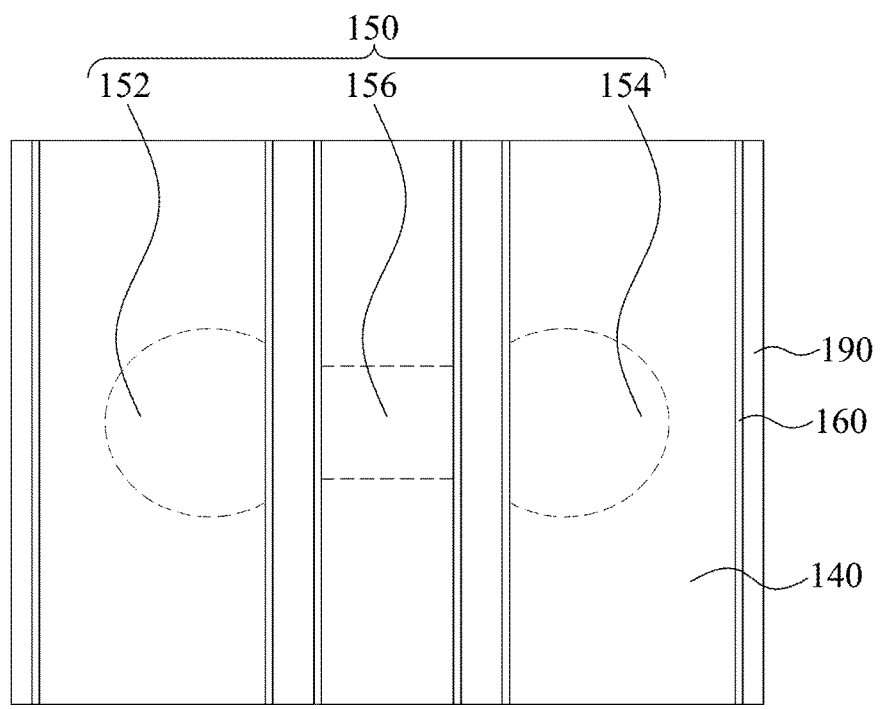

Referring to FIGS. 7A to 7C, FIG. 7B is a cross-sectional view taken along line B-B of FIG. 7A, and FIG. 7C is a top view of FIG. 7A. A dielectric layer 190 is formed on the first gate structure 180, the second gate structure 182, the third gate structure 184, and the fourth gate structure 186.

In some embodiments, the gate dielectric layer 160 has a portion 162 between the dielectric layer 190 and the active region 150. In greater details, the portion 162 of the gate dielectric layer 160 includes a portion between the dielectric layer 190 above the first gate structure 180 and the third portion 156 of the active region 150, and a portion between the third portion 156 of the active region 150 and the dielectric layer 190 above the second gate structure 182.

In some embodiments, the gate dielectric layer 160 has a portion 164 between the first gate structure 180 and the second gate structure 182 and the active region 150. In greater details, the portion 164 of the gate dielectric layer 160 includes a portion between the first gate structure 180 and the third portion 156 of the active region 150, and a portion between the third portion 156 of the active region 150 and the second gate structure 182.

In some embodiments, the dielectric layer 190 is made of silicon nitride or other suitable dielectric materials. In some embodiments, the dielectric layer 190 is formed by chemical vapor deposition (CVD), ALD, or other suitable process.

In some embodiments, the method of forming the dielectric layer 190 may include forming the dielectric layer 190 to cover the gate structures (the first gate structure 180, the second gate structure 182, the third gate structure 184, and the fourth gate structure 186), the gate dielectric layer 160, and the isolation structure 140, and performing a planarization operation, such as a chemical mechanical polishing (CMP) method and/or an etch-back method such that a portion of the dielectric layer 190 is removed. In other words, a top surface of the dielectric layer 190, a top surface of the gate dielectric layer 160, and the top surface of the isolation structure 140 are substantially coplanar. In some embodiments, the top surface of the dielectric layer 190, the top surface of the gate dielectric layer 160, and the top surface of the isolation structure 140 are at same horizontal level.

In some embodiments, as shown in FIG. 7B, the semiconductor structure 10 includes two transistors. The second segment 156b of the third portion 156 serves as a common source region of the transistors. The second segment 152b of the first portion 152 and the second segment 154b of the second portion 154 serve as drain regions of the transistors.

Figure 8:
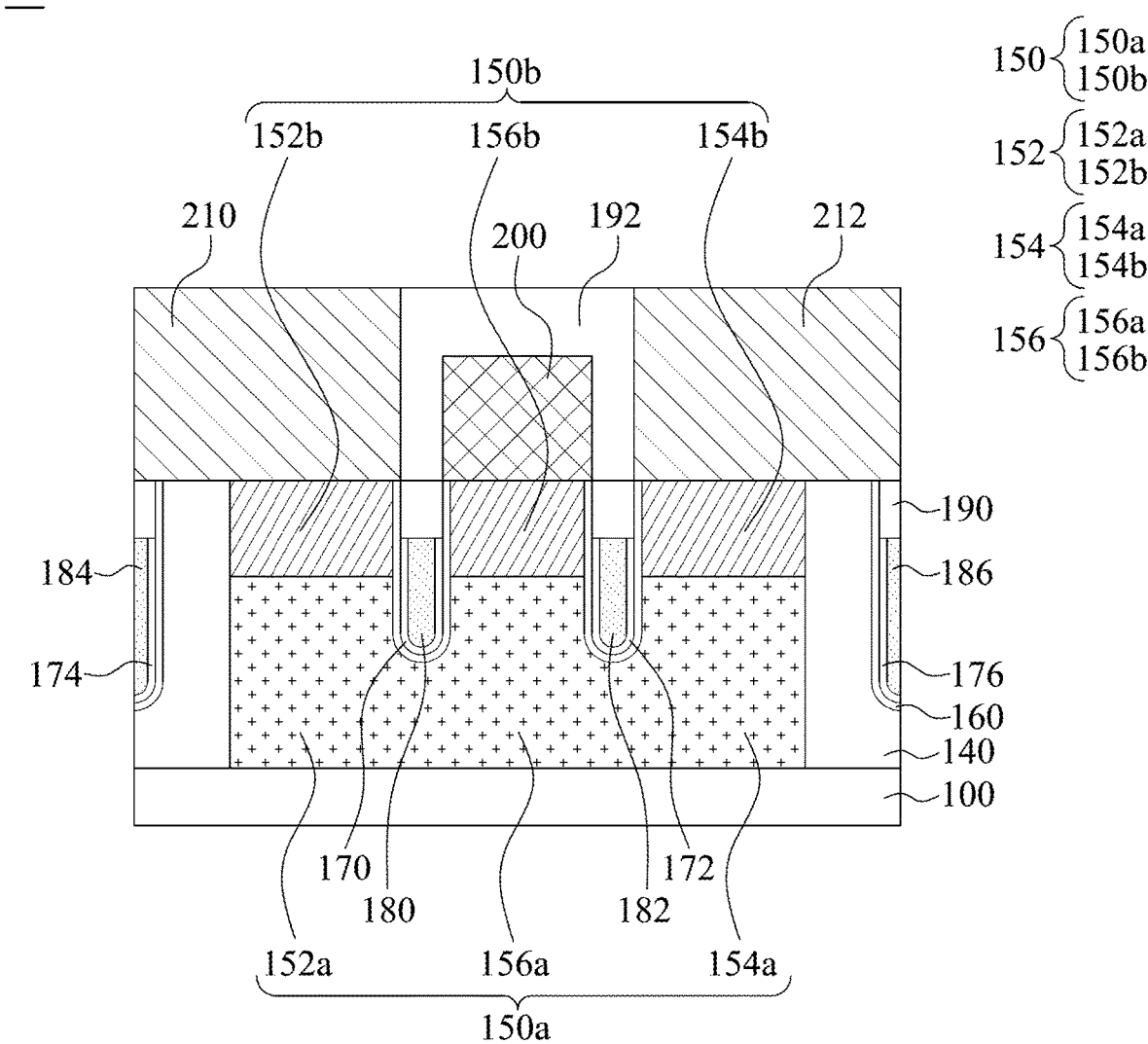
FIG. 8 is a schematic cross-sectional view of a method of forming a semiconductor structure at another stage in accordance with an embodiment of the present disclosure.

Referring to FIG. 8, FIG. 8 is a schematic cross-sectional view of a method of forming a semiconductor structure 10 at another stage in accordance with an embodiment of the present disclosure. After the dielectric layer 190 is formed of FIGS. 7A, 7B, and 7C, a planarization operation, such as a chemical mechanical polishing (CMP), is performed such that a portion of the isolation structure 140, the gate dielectric layer 160, and the dielectric layer 190 are removed. As such, the second segment 152b of the first portion 152 of the active region 150, the second segment 156b of the third portion 156 of the active region 150, and the second segment 154b of the second portion 154 of the active region 150 are exposed.

After the planarization operation is performed, another dielectric layer 192 is formed on the dielectric layer 190. Then, a contact 200, a first conductive component 210 and a second conductive component 220 are formed. In greater details, the contact 200 is formed on the second segment 156b of the third portion 156 of the active region 150 and is surrounded with the dielectric layer 192. The first conductive component 210 is formed on the second segment 152b of the first portion 152 of the active region 150, and the second conductive component 212 is formed on the second segment 154b of the second portion 154 of the active region 150. Stated differently, the second segment 152b of the first portion 152 of the active region 150, the second segment 156b of the third portion 156 of the active region 150, and the second segment 154b of the second portion 154 of the active region 150 are electrically connected to the first conductive component 210, the contact 200, and the second conductive component 212, respectively. The first conductive component 210 and the second conductive component 212 are spaced apart by the contact 200 and the dielectric layer 192. In other words, the contact 200 is disposed between the first conductive component 210 and the second conductive component 212. In some embodiments, the first conductive component 210 and the second conductive component 212 are capacitors or conductive lines.

In some embodiments, the contact 200, the first conductive component 210, and the second conductive component 212 may be formed in one step. In other embodiments, the contact 200 is formed and then the first conductive component 210 and the second conductive component 212 are formed.

In some embodiments, a top surface of the contact 200 is below a top surface the first conductive component 210. In some embodiments, the top surface of the contact 200 is below a top surface of the second conductive component 212. In other embodiments, the top surface of the first conductive component 210 is aligned with, e.g., at same horizontal level as, the top surface of the second conductive component 212.

In summary, the semiconductor structure includes the active region, the isolation structure, the first gate structure, and the second gate structure. The active portion has the first portion, the second portion, and the third portion between the first portion and the second portion. The shape of the first portion is different from the shape of the third portion. By using this semiconductor structure, not only better driving capability can be achieved but also leakage property can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method, comprising:
   forming a semiconductor layer on a semiconductor substrate;

patterning the semiconductor layer to form a semiconductive structure on the semiconductor substrate, wherein each of widths of two ends of the semiconductive structure is wider than a width of a middle of the semiconductive structure;

doping the semiconductive structure to form a doped semiconductor structure;

forming an isolation structure surrounding the doped semiconductor structure;

performing a recessing process such that two trenches are formed on the doped semiconductor structure, and a first portion, a second portion, and a third portion of an active region are formed on the semiconductor substrate; and forming a first gate structure and a second gate structure in the trenches such that the first portion and the third portion are partially spaced apart by the first gate structure, and the second portion and the third portion are partially spaced apart by the second gate structure.

2. The method of claim 1, wherein the doped semiconductor structure has a dumbbell shape, in a top view.

3. The method of claim 1, further comprising forming a gate dielectric layer on sidewalls of the first portion, the second portion, and the third portion of the active region before the first gate structure and the second gate structure are formed.

4. The method of claim 3, further comprising forming a dielectric layer on the first gate structure and the second gate structure.

5. The method of claim 4, wherein the gate dielectric layer has a portion between the dielectric layer and the active region.

6. The method of claim 3, wherein the gate dielectric layer has a portion between the first gate structure and the second gate structure and the active region.

7. The method of claim 1, wherein patterning the semiconductor layer to form the semiconductive structure on the semiconductor substrate is performed by using an extreme ultraviolet lithography process.

8. The method of claim 1, wherein doping the semiconductive structure further comprises performing a doping operation such that a first doped region and a second doped region are formed.

9. The method of claim 8, wherein a doping impurity of the first doped region is different from that of the second doped region.

* * * * *